United States Patent [19]

Russell

[11] 4,097,888
[45] Jun. 27, 1978

[54] HIGH DENSITY COLLECTOR-UP STRUCTURE

[75] Inventor: Lewis K. Russell, San Jose, Calif.

[73] Assignee: Signetics Corporation, Sunnyvale, Calif.

[21] Appl. No.: 766,483

[22] Filed: Feb. 7, 1977

Related U.S. Application Data

[63] Continuation of Ser. No. 622,714, Oct. 15, 1975, abandoned.

[51] Int. Cl.² .............................................. H01L 29/72
[52] U.S. Cl. ...................................... 357/46; 357/35; 357/36; 357/44; 357/48
[58] Field of Search ..................... 357/40, 46, 44, 36, 357/89, 37, 35, 92, 48; 307/303

[56] References Cited

U.S. PATENT DOCUMENTS

| | | | |
|---|---|---|---|
| 3,486,085 | 12/1969 | Slavin | 357/27 |
| 3,657,612 | 4/1972 | Wiedmann | 357/36 |
| 3,853,644 | 12/1974 | Tarui et al. | 357/56 |
| 3,925,120 | 12/1975 | Saida et al. | 148/175 |
| 4,005,470 | 1/1977 | Tucci et al. | 307/303 |
| 4,035,664 | 7/1977 | Berger et al. | 357/36 |

Primary Examiner—Stanley D. Miller, Jr.
Assistant Examiner—James W. Davie
Attorney, Agent, or Firm—Jerry A. Dinardo; C. Richard Pfeiffer; William H. Dana

[57] ABSTRACT

A high density semiconductor structure and method is disclosed including a semiconductor body of one conductivity having a substantially planar surface. A first region of one conductivity is formed in the body and extends to the surface. A layer of opposite conductivity is interposed between the first region and the body said layer having relatively thin and uniform walls which extend to separate the first region from the body. At least one opposite conductivity region is formed entirely within the first region and extends to the surface. An opposite conductivity region is formed in the body and overlaps a portion of the layer. Lead means are provided for contacting each of the respctive regions and the body. The collector-up injection logic structure thus formed requires little or no surface area for the injection source transistor.

11 Claims, 15 Drawing Figures

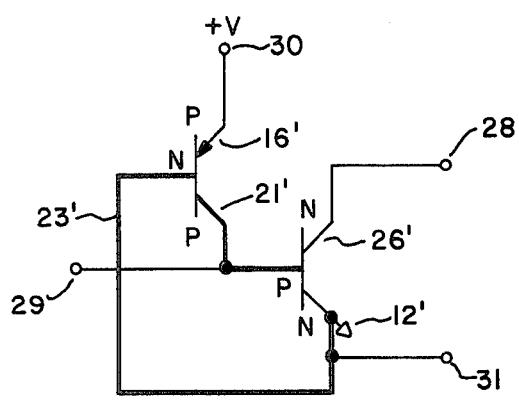
FIG.—1B
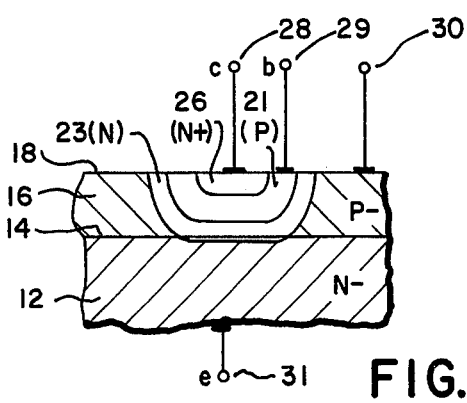
FIG.—1A
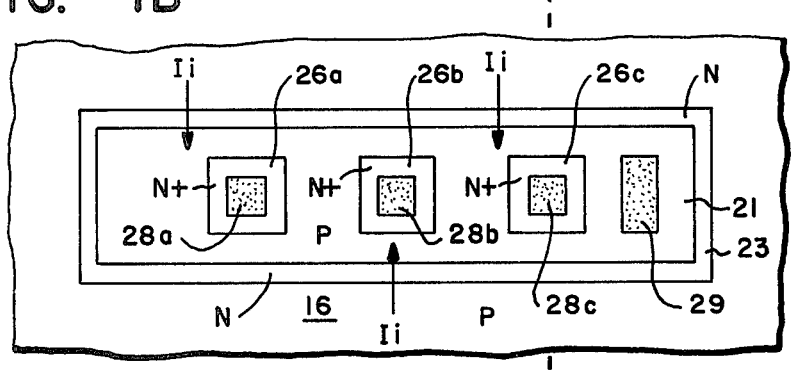
FIG.—1C
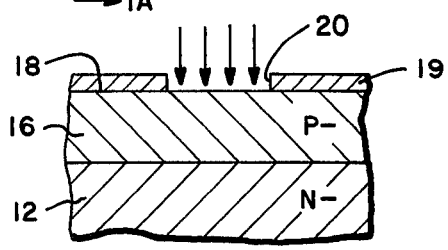
FIG.—2A
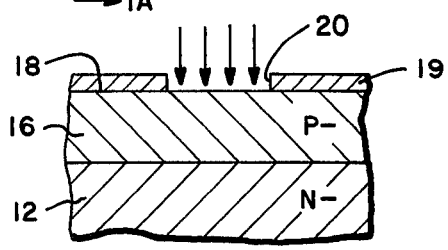
FIG.—2B
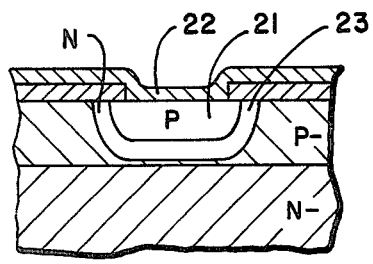
FIG.—2C
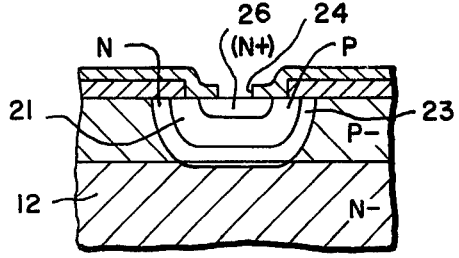
FIG.—2D
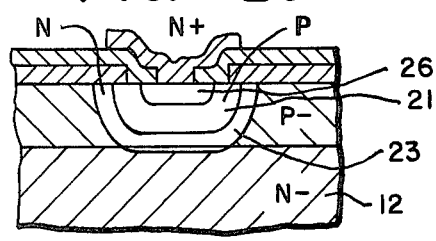
FIG.—2E

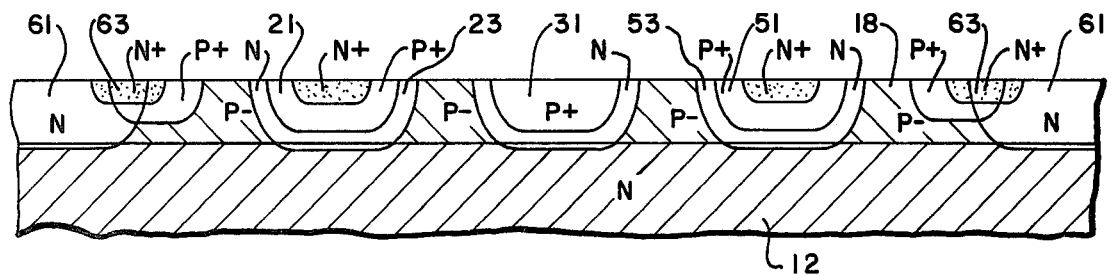
FIG.—3B
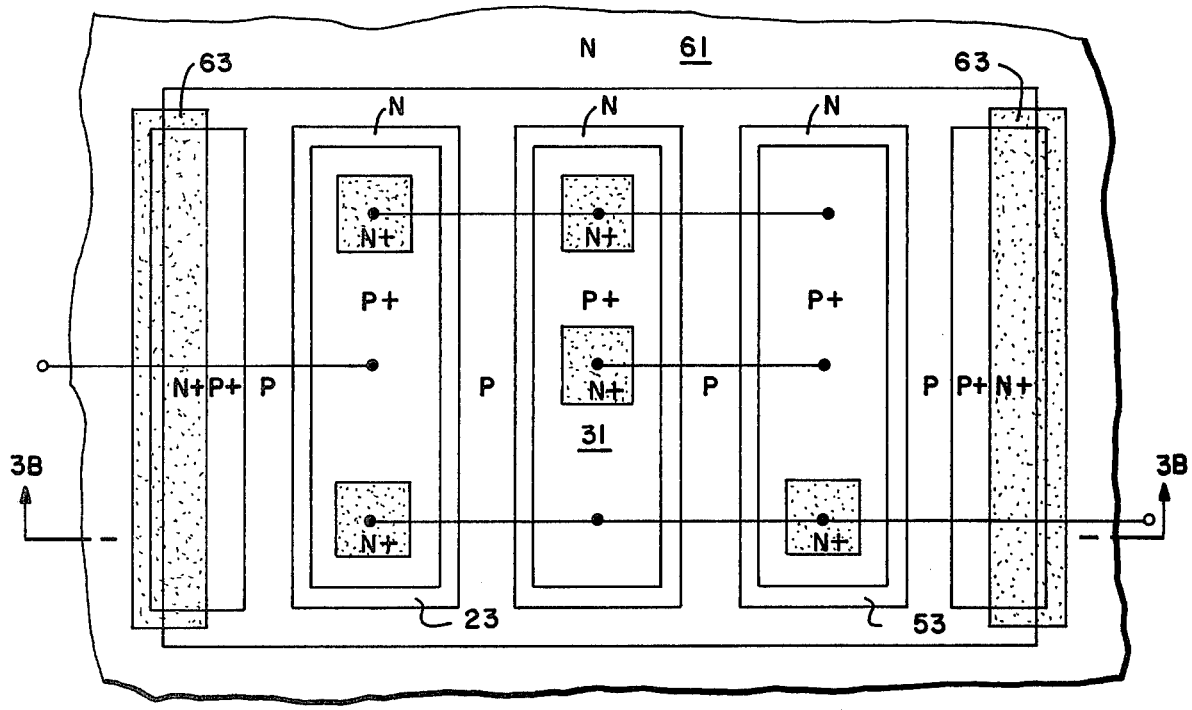
FIG.—3A
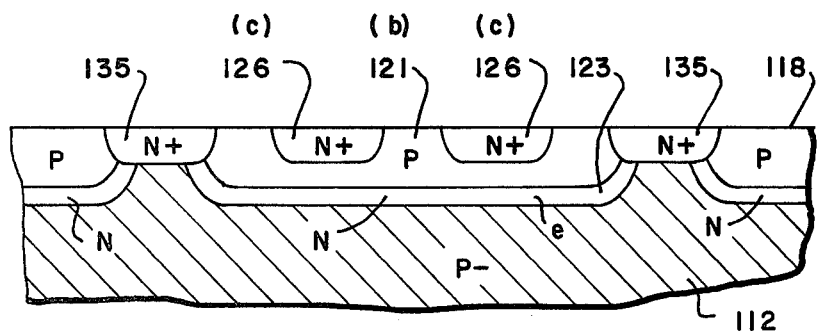
FIG.—4A

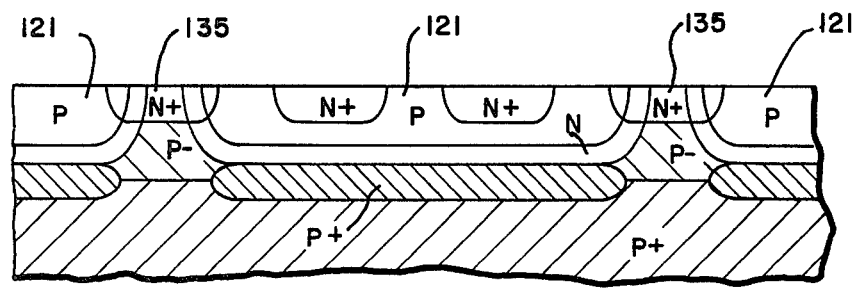
FIG.—4C
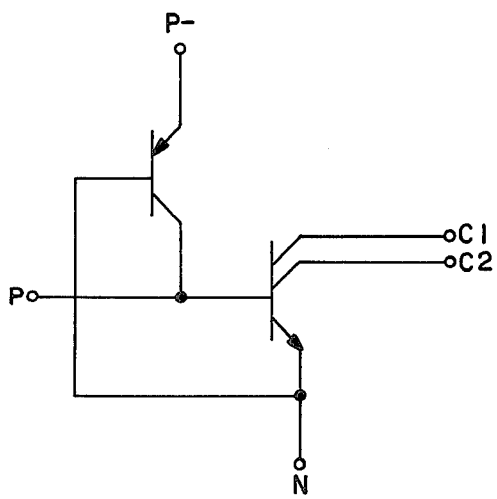
FIG.—4B
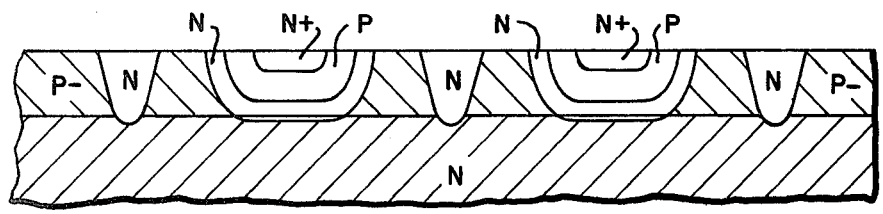
FIG.—5A
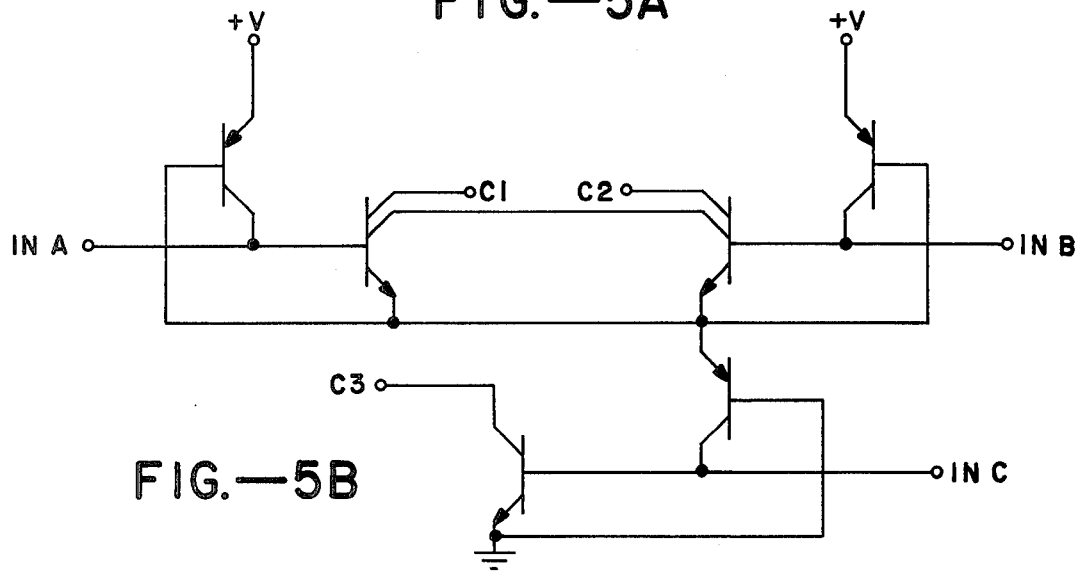
FIG.—5B

HIGH DENSITY COLLECTOR-UP STRUCTURE

This is a continuation, of application Ser. No. 622,714 filed Oct. 15, 1975, and now abandoned.

BACKGROUND OF THE INVENTION

This invention relates generally to a bipolar semiconductor switching structure and a method for fabrication. More particularly, this invention relates to a bipolar semiconductor switching structure suitable for collector-up injection logic circuitry and capable of being formed in extremely dense arrays.

Although very dense, bipolar transistor, integrated injection logic structures have heretofore been provided, such structures have generally required an injection source transistor which occupies a substantial portion of the semiconductor surface area. Moreover, a number of source transistors must be provided within a large array to ascertain that adequate carriers are injected into each of the logic devices in a large array. Such plural source transistors occupy excessive semiconductor area. Thus, there is a need for a collector-up injection logic structure which occupies a reduced semiconductor area.

OBJECTS AND SUMMARY OF THE INVENTION

Accordingly, it is a general object of the present invention to provide an improved collector-up injection logic structure of greatly reduced size which may be formed in high density arrays.

It is a particular object of the present invention to provide an improved semiconductor injection logic structure having an injection transistor which requires little or no semiconductor surface area.

It is a further particular object of the present invention to provide an improved semiconductor injection logic structure capable of providing a relatively uniform source of injected carriers for a large array of logic without occupying substantial semiconductor surface area.

The foregoing and other objects of the invention are achieved in a high density semiconductor structure, and method for fabrication, the structure including a semiconductor body of one conductivity having a substantially planar surface and a first region of one conductivity formed in said body extending to said surface. A layer of opposite conductivity is interposed between the first region and the body, the layer having relatively thin and uniform walls which extend to separate the first region from the body. At least one opposite conductivity region is formed entirely within the first region and extends to the surface. An opposite conductivity region is formed in the body and overlaps a portion of the layer. Lead means are provided for contacting each of the respective regions to provide the collector-up injection logic structure.

BRIEF DESCRIPTION OF THE DRAWINGS

FIG. 1A is a cross-sectional view of a portion of a semiconductor body incorporating the present invention;

FIG. 1B is a schematic diagram showing the equivalent electrical circuit of the FIG. 1A structure;

FIG. 1C is a top view showing a semiconductor structure incorporating the present invention;

FIGS. 2A–E are cross-sectional views of a portion of a semiconductor body showing the steps required to fabricate the present invention;

FIGS. 3A and B shows the respective top and cross-sectional views of an additional embodiment of the present invention;

FIG. 4A is a cross-sectional view of a portion of a semiconductor body incorporating an additional embodiment of the present invention;

FIG. 4B is a schematic diagram of the equivalent electrical circuit of the FIG. 4A structure;

FIG. 4C is a schematic view of a portion of a semiconductor body incorporating improvements in the FIG. 4A structure in accord with the present invention;

FIG. 5A is a cross-sectional view of a portion of a semiconductor body showing a plurality of semiconductor structures in accord with the present invention; and FIG. 5B is a schematic diagram of the equivalent electrical circuit of the FIG. 5A structure.

DETAILED DESCRIPTION OF THE PREFERRED EMBODIMENT

A plurality of semiconductor structures utilizing carrier injection to perform logic switching operations are shown in the accompanying drawings. The structures include a multiple collector switching transistor and an associated source transistor to provide injected carriers for operation. In operation the present invention utilizes the uppermost regions formed in the semiconductor body as collector regions. Hence they are designated "collector-up" structures to distinguish them from conventional transistors where the lowermost portion of the structure is utilized as a collector region. Two collector-up structures are disclosed and claimed in co-pending applications entitled "Collector-Up Semiconductor Structure and Method," Ser. No. 454,789, filed Mar. 26, 1974, abandoned in favor of application Ser. No. 809,615 filed June 24, 1977, and "Self-Isolated Collector-Up Structure and Method" Ser. No. 468,937, filed May 10, 1974, abandoned in favor of application Ser. No. 615,571 filed Sept. 22, 1975, now abandoned both in the name of Lewis K. Russell and assigned to the present assignee. In the present invention a relatively thin and uniform layer is interposed within a collector-up structure to provide a highly efficient injection source which requires little or no semiconductor surface area. A PNP injection source is formed generally underlying the semiconductor surface area occupied by the NPN switching transistor which it serves. The PNP geometry provides reasonably high current gain for injecting carriers without substantial drop in base current over extended NPN base areas. In operation a supply voltage of 0.6–0.8 volts provides logic levels of approximately 0.6 and 0.02 volts.

Referring to FIG. 1A, a first embodiment of the present invention is shown. The semiconductor structure includes an N type substrate 12 having a major surface 14 and a P− epitaxial layer 16 formed on surface 14. Layer 16 has a substantially planar surface 18. A first P+ type region 21 is then formed in layer 16 extending to surface 18. A relatively thin and uniform N type layer 23 is interposed between region 21 and layer 16, the N type layer 23 extending to overlap a portion of body 12. Layer 23 may be relatively thin of the order of 0.7 microns. An N+ region 26 is formed entirely within the region 21 and extends to surface 18 to form the collector of the logic structure.

The equivalent electrical circuit of FIG. 1A structure is shown in FIG. 1B where the prime reference characters correspond to the previously described structural elements of FIG. 1A. FIG. 1C shows the top view of a semiconductor body corresponding to the cross-section of FIG. 1A and including plural N+ collectors 26a–26b. Respective collector contact areas 28a–28c provide contact for interconnections such as by a patterned aluminum interconnecting layer insulated from and carried by surface 18. Base contact area 29 is provided to connect to region 21 and emitter contact 31 (FIG. 1A) provides contact to the N body 12.

Layer 23 directly underlies and is in intimate contact with a major portion of base region 21 of the NPN transistor thus ensuring greatly improved injection performance. The injection occurs around the periphery of layer 23 as indicated by the arrows designated $I_i$. Moreover, as is well known, circuit power consumption is determined principally by the effectiveness of the PNP injectors therefore much lower power is required due to the improved injection. Correspondingly a lower power-delay product is provided.

Turning to fabrication, the sequence of processing steps are shown in FIGS. 2A–E. Referring to FIG. 2A, an N type semiconductor body 12 having a major surface 14 is the starting material. A P− epitaxial layer 16 is formed on surface 14 such as by a conventional epitaxial process. Epitaxial layer 16 is formed to a thickness of approximately 2 microns. Epitaxial layer 16 may be varied in thickness so long as the N layer to be subsequently formed is capable of extending through the epitaxial layer to overlap a portion of the N type body 12. Epitaxial layer 16 has a substantially planar surface 18. An oxide layer 19 such as silicon dioxide is formed on surface 18.

As shown in FIG. 2B, an aperture 20 of a predetermined area is formed in layer 19 to expose a portion of the upper surface 18. Phosphorus and boron ions are implanted into the P− surface 18 exposed by aperture 20. Next the layer and the respective ions therein are exposed to an elevated thermal diffusion temperature, FIG. 2C. The phosphorus outstrips the boron, that is the phosphorus diffuses faster by virtue of the relative impurity diffusion coefficients, thus forming an N type region or layer 23 and a P region 21. The respective regions are substantially selfaligned with respect to each other to insure a relatively thin uniform layer 23. Simultaneous with the diffusion a second relatively thin oxide layer 22, such as silicon dioxide, is formed filling aperture 21 and covering the exposed portion of surface 18.

Next, as shown in FIG. 2D the resultant oxide layer 22 has an aperture 24 formed therein to expose a portion of surface 18 within region 21. Next an N type impurity, such as phosphorus, is diffused through aperture 24 to form N+ region 26 entirely within region 21 and extending to surface 18. Simultaneous with the diffusion of the region 26, the region 21 and layer 23 have continued to diffuse with the initial phosphorus diffusion front of layer 23 intersecting the N type body 12 and overlapping the body so that the layer 23 can be biased via the body 12 which may serve as a contact for the common or ground voltage bias as will be seen. The N layer 23 thickness is determined by the difference in diffusion coefficients for the respective impurities. Accordingly, the base width can be made extemely narrow by controlling the diffusion process to thereby provide relatively high PNP beta.

Next, referring to FIG. 2E, apertures are formed exposing each of the respective regions at surface 18 and interconnections and contacts such as a patterned aluminum layer, are provided. The contact to layer 23 is provided via a contact to body 12.

Referring to FIGS. 3A and 3B, a spaced semiconductor structure including bases 21 and 51 and interposed layers 23 and 53 are shown. It has been found that when for reasons of high density several bases such as 21 and 51 are to be closely spaced, an additional P region 31 may be formed simultaneous with the second P diffusion previously described in conjunction with FIG. 2. The additional P regions reduce the resistance of the P− epitaxial layer where necessary and desirable. Moreover, unnecessary PN junction leakage may be eliminated by encompassing the desired epitaxial area with a N type region 61 formed extending from surface 18 downward to contact the underlying body 12 and encompassing the semiconductor logic structure. This may be particularly desirable where a PNP injection is not required or desirable within a portion of an integrated circuit. Further, a N+ guardband region 63 may be formed extending downward from surface 18 to overlap a portion of the PN junction formed by the P− layer and the N type area diffusion region 61. The N+ guardband region 63 has been found to further limit the injection toward undesirable areas.

Referring to FIGS. 4A and 4B, an additional embodiment of the present invention is shown. In FIG. 4A, a semiconductor structure is shown utilizing a P− body 112. By a fabrication process identical to that described in conjunction with FIGS. 2A–E N type layer 123 is formed, a P type base region 121 and plural type N+ collectors 126 and are formed. Simultaneous with the formation of the N+ collectors 126, additional N type contact regions 135 are formed downward from the surface 118 and overlapping a portion of N layer 123 at and adjacent to surface 118. Further, in the case of plural semiconductor structures, additional N type contacts 135 may be formed extending from surface 118 downward and overlapping adjacent N type layers 123. The N+ contact regions may typically have a width of approximately 5 microns. It is to be appreciated that the injection by the PNP injection structure is accomplished from below the base region 121 and the injection transistor occupies little semiconductor area. Base current for the PNP base flows through the N+ contact regions 135 with most of the injection occuring near the N+ contacts and being reduced as the base current experiences an ohmic drop traveling from the edge N+ regions 135 toward the center of the region 123. The base current, in operation, establishes a decreasing current gradient as the current is caused to pass further from the N type contact regions 135. FIG. 4B shows the equivalent electrical circuit of FIG. 4A structure having prime reference numbers indicating the corresponding circuit elements.

In operation of the FIGS. 4A and B circuit, the N contact 135 would be connected to ground and the P− substrate would have lead means attached thereto for providing a voltage supply of +0.6 to 0.8 volts. Referring to FIG. 4C, a P− substrate having a buried layer formed therein has a P− epitaxial layer formed on the surface thereof. It has been found that the structure incorporating the P+ buried layer has increased gain and offers additional improvement in efficiency over the FIG. 4A structure. The N+ contact regions 135 provide current for the PNP base devices and further act to separate the respective NPN base regions 121 from one another.

Separate N+ contact regions 135 can be provided to each of the separate base regions 121 to provide independent N structure contacts, FIG. 5. Spaced and isolated semiconductor devices may thereby be formed utilizing dielectric isolation, such as by a V-shaped groove extending from the planar surface downward to expose a portion of the underlying substrate. Alternately isolation may include an N+ diffusion extending from the surface downward through a P− epitaxial layer to contact the underlying N type substrate. In either case, it is possible to stack first, second and third collector-up structures using the independent N+ regions interconnected as shown in FIG. 5A. The equivalent electrical circuit having prime reference numbers indicating the corresponding circuit elements is shown in FIG. 5B. It is readily apparent that an extremely dense integrated circuit can thus be formed and selectively interconnected to perform a wide variety of logic functions such as NOR, AND and other basic logic elements.

Thus, it is apparent that there has been provided an improved collector-up injection logic circuit of greatly reduced size which may be formed in high density arrays. Further, an improved semiconductor injection logic structure has been provided having an injection transistor which requires little or no semiconductor surface area. In addition, there has been provided an improved semiconductor injection logic structure capable of providing a relatively uniform source of injected carrier for a large array of logic without occupying substantial semiconductor surface area.

What is claimed is:

1. A high density semiconductor structure comprising:
   (a) a body of semiconductor material including a stratum of first conductivity type having a substantially planar surface;
   (b) first and second nested regions disposed within said stratum so as to extend from said planar surface to different depths below the surface of said stratum, said first region being of second conductivity type opposite said first conductivity type and disposed within said stratum so as to form a first semiconductor junction therebetween, said second region being of said first conductivity type and nested within said first region to form a second semiconductor junction therebetween, said first region being substantially uniform in thickness and relatively thin as compared to its depth below the surface of said stratum;
   (c) a plurality of third regions of said second conductivity type disposed within said second region in spaced apart relation to form a like plurality of third semiconductor junctions therebetween; and
   (d) contact means connected to said stratum and said regions whereby, upon application of a potential difference forward biasing said first semiconductor junction, said stratum, said first region and said second region form the elements of an injection source transistor, and said first, second and third regions form a plurality of collector-up transistors.

2. The invention according to claim 1, wherein said semiconductor body includes a substrate of said second conductivity type and an epitaxial layer thereon constituting said stratum, said first region extending the entire thickness of said epitaxial layer and intersecting said substrate.

3. A high density semiconductor structure comprising:
   (a) a body of semiconductor material including a stratum of first conductivity type having a substantially planar surface;
   (b) a pair of first and second nested regions spaced laterally within said stratum, the first and second regions extending from said planar surface to different depths below the surface of said stratum, each of said first regions being of second conductivity type opposite said first conductivity type and disposed within said stratum so as to form a first semiconductor junction therebetween, each of said second regions being of said first conductivity type and nested within a respective one of said first regions to form a second semiconductor junction therebetween, each of said first regions being substantially uniform in thickness and relatively thin as compared to its depth below the surface of said stratum;
   (c) a plurality of third regions of said second conductivity type spaced laterally within each of said second regions to form a like plurality of third semiconductor junctions therebetween; and
   (d) contact means connected to said stratum and said regions whereby, upon application of a potential difference forward biasing each of said first semiconductor junctions, said stratum and each nested first and second regions form the elements of an injection source transistor and each nested first and second regions combined with a respective plurality of said third regions form a plurality of collector-up transistors.

4. The invention according to claim 3, and further including a surface region of said second conductivity type extending partly into said stratum and intersecting peripheral portions of the two adjacent first regions of said pair.

5. A high density semiconductor structure comprising:
   (a) a body of semiconductor material including a a substrate and an epitaxial layer thereon having a substantially planar surface, said epitaxial layer being of first conductivity type and said substrate being of second conductivity type opposite said first conductivity type;
   (b) first, second and third nested regions disposed within said epitaxial layer so as to extend from said planar surface to varying depths below the surface of said epitaxial layer, said first region being of said second conductivity type and disposed within said epitaxial layer so as to form a first semiconductor junction therebetween, said first region extending the entire thickness of said epitaxial layer and intersecting said substrate, said second region being of said first conductivity type and nested within said first region to form a second semiconductor junction therebetween, and said third region being of said second conductivity type and nested within said second region to form a third semiconductor junction therebetween, said first region being substantially uniform in thickness and relatively thin as compared to its depth below the surface of said epitaxial layer; and
   (c) contact means connected to said epitaxial layer and said regions whereby, upon application of a potential difference forward biasing said first semiconductor junction, said epitaxial layer, said first region and said second region form the elements of an injection source transistor and said first, second, and third regions form the elements of a collector-up transistor.

6. The invention according to claim 5 wherein said contact means comprises contacts made at the surface to said epitaxial layer, said second region, and said third region, and a contact made to said substrate at a region spaced from said epitaxial layer.

7. The invention according to claim 5 wherein a plurality of said third regions are incorporated within single first and second nested regions.

8. The invention according to claim 5 wherein said body of semiconductor material contains a plurality of said nested regions laterally spaced therein, and further including isolation means interposed between adjacent nested regions.

9. The invention according to claim 8, wherein said isolation means includes a region of second conductivity type disposed between adjacent nested regions and extending the entire depth of said epitaxial layer and intersecting said substrate.

10. A high density semiconductor structure comprising:
    (a) a body of semiconductor material including a a substrate of first conductivity type and an epitaxial layer thereon of said first conductivity type having a substantially planar surface;
    (b) first, second and third nested regions disposed within said epitaxial layer so as to extend from said planar surface to varying depths below the surface of said epitaxial layer, said first region being of second conductivity type and disposed within said epitaxial layer so as to form a first semiconductor junction therebetween, said second region being of said first conductivity type and nested within said first region to form a second semiconductor junction therebetween, and said third region being of said second conductivity type and nested within said second region to form a third semiconductor junction therebetween, said first region being substantially uniform in thickness and relatively thin as compared to its depth below the surface of said epitaxial layer;
    (c) a buried layer of said first conductivity type intersecting said substrate, said epitaxial layer and said first region, said epitaxial layer being more lightly doped than said substrate and said buried layer; and
    (d) contact means connected to said epitaxial layer and said regions whereby, upon application of a potential difference forward biasing said first semiconductor junction, said epitaxial layer, said first region and said second region form the elements of an injection source transistor, and said first, second and third regions form the elements of a collector-up transistor.

11. The invention according to claim 10, and further including at least one additional region of second conductivity type extending from said planar surface and contacting said epitaxial layer, said first region and said second region.

* * * * *